United States Patent [19]

Yamada et al.

[11] Patent Number: 5,585,305
[45] Date of Patent: Dec. 17, 1996

[54] METHOD FOR FABRICATING A SEMICONDUCTOR DEVICE

[75] Inventors: Masato Yamada; Takao Takenaka, both of Annaka, Japan

[73] Assignee: Shin-Etsu Handotai Co. Ltd., Tokyo, Japan

[21] Appl. No.: 249,197

[22] Filed: May 26, 1994

Related U.S. Application Data

[63] Continuation-in-part of Ser. No. 935,562, Aug. 26, 1992, abandoned.

[30] Foreign Application Priority Data

Aug. 29, 1991 [JP] Japan ................... 3-244832

[51] Int. Cl.[6] ................................. H01L 33/00
[52] U.S. Cl. ............ 437/127; 437/129; 437/130; 437/160; 148/DIG. 99
[58] Field of Search ................... 437/160, 129, 437/127, 130; 148/DIG. 99

[56] References Cited

U.S. PATENT DOCUMENTS

| | | | |
|---|---|---|---|
| 3,880,680 | 4/1975 | Weyrich et al. | 437/130 |
| 4,001,055 | 1/1977 | Charmakadze et al. | 437/130 |
| 4,414,558 | 11/1983 | Nishizawa et al. | |
| 4,905,058 | 2/1990 | Yamada et al. | |

FOREIGN PATENT DOCUMENTS

| | | |
|---|---|---|
| 0417348 | 9/1989 | European Pat. Off. |
| 3104082 | 2/1981 | Germany. |

OTHER PUBLICATIONS

IBM Technical Disclosure Bulletin, vol. 13, No. 9, Feb. 1971, p. 2611; Shang, et al., PN Junction Formation by Substrate Back Diffusion Tech.

*Primary Examiner*—Robert Kunemund
*Attorney, Agent, or Firm*—Ronald R. Snider

[57] ABSTRACT

A method for fabricating a semiconductor device includes the steps of growing a second semiconductor layer on a first semiconductor layer which is highly doped with an impurity such as Zn and diffusing the impurity concurrently with the growing step of the second semiconductor layer from the first semiconductor layer as an impurity source to the second semiconductor layer to have a predetermined carrier concentration profile, by controlling both the diffusing speed of said impurity and the growing speed of said second semiconductor layer by changing the temperature in accordance with a predetermined sequence to have a predetermined carrier concentration profile in the second semiconductor layer.

7 Claims, 5 Drawing Sheets

METHOD FOR FABRICATING A SEMICONDUCTOR DEVICE

RELATED APPLICATIONS

This application is a continuation-in-part of application Ser. No. 07/935,562 filed Aug. 26, 1992 now abandoned which claims priority based on Japanese Application 3-244832, Aug. 29, 1991.

FIELD OF THE INVENTION

This invention relates to a method for fabricating a semiconductor device, and in particular to a method for fabricating a semiconductor device such as a light emitting device provided with a semiconductor layer having a desired carrier concentration profile.

BACKGROUND OF THE INVENTION

A method for fabricating a semiconductor device, such as a light emitting device, includes the steps of forming a plurality of semiconductor layers having different conductive types and different carrier concentrations on a semiconductor substrate and forming electrodes on the semiconductor layers. In a method for fabricating a double hereto junction type light emitting device which is most typical of light emitting devices, for example, a three-layer structure consisting of an active layer and a pair of clad layers between which the active layer is sandwiched is formed on a semiconductor substrate. In a method fabricating such a semiconductor device, impurities are introduced into the semiconductor layers by several kinds of methods in order to make the semiconductor layers have desired carrier concentrations.

In one of the methods for introducing an impurity into a semiconductor layer (the first method) for example, an impurity is diffused from an impurity source located on the outside into a semiconductor layer which has been already formed. In the first method, the impurity which is vaporized from the impurity source such as a solid impurity diffusion source is diffused into the semiconductor layer through the surface thereof, and heating treatment of the semiconductor layer is carried out to make the semiconductor layer have a desired carrier concentration.

In another of the methods for introducing an impurity into a semiconductor layer (the second method), an impurity is already added to materials from which a semiconductor layer is generated, and the semiconductor layer having a desired carrier concentration is generated directly from the materials including the impurity. This method is further divided into two classes, one of which is the vapor phase growth method in which a semiconductor layer is grown from vapor phase materials, and the other of which is the liquid phase growth method in which a semiconductor layer is given from liquid phase materials.

However, there are disadvantages in the methods mentioned above. In the first method for introducing an impurity into a semiconductor layer, the impurity is diffused through the surface of the semiconductor layer, so that the carrier concentration profile of the semiconductor layer has a tendency in that the carrier concentration is higher in the vicinity of the surface of the semiconductor layer and becomes lower as the distance from the surface in depth increases.

On the other hand, in the second method for introducing an impurity into a semiconductor layer, the carrier concentration depends on the impurity concentration of the material from which the semiconductor layer is generated or the diffusion temperature, etc., so that it is difficult to adjust the carrier concentration after the semiconductor layer is formed.

In particular, on a double hereto junction type light emitting device, it has been confirmed by the inventors that the light emitting device has a high luminance if a carrier concentration of a clad layer in the vicinity of an active layer is lower than a predetermined value. However, such a specific carrier concentration profile can not be obtained by the methods shown above.

SUMMARY OF THE INVENTION

Accordingly, it is an object of this invention to provide a method for fabricating a semiconductor device in which the carrier concentration of a semiconductor layer, such as a clad layer of the semiconductor device, especially a double hereto junction type light emitting device, can be controlled to be a targeted value within a relatively low concentration region.

According to a feature of the invention, a method for fabricating a semiconductor device includes the following steps of:

(a) forming a second semiconductor layer on a first semiconductor layer which is highly doped with an impurity by the liquid phase epitaxy in which a solution for growing the second semiconductor layer is located on the first semiconductor layer and the second semiconductor layer grows by lowering the temperature of the solution; and (b) diffusing the impurity concurrently with step (a) from the first semiconductor layer as an impurity source to the second semiconductor layer;

wherein both the diffusing speed of the impurity and the growing speed of the second semiconductor layer are controlled by changing the temperature in accordance with a predetermined sequence to have a predetermined carrier concentration profile in the second semiconductor layer.

In the diffusion step (b), the impurity, which is highly doped in the first semiconductor layer, diffuses from the first semiconductor layer to the second semiconductor layer through the interface thereof by applying heat. By such a diffusion process, the carrier concentration profile of the second semiconductor layer becomes such that the carrier concentration in the vicinity of the interface between the first and second semiconductor layers is equal to that of the first semiconductor layer and the carrier concentration becomes lower as the distance from said interface increases. Therefore, the carrier concentration is very low in the surface of the second semiconductor layer in which the distance from the first layer is the largest. Consequently, it is possible to control the carrier concentration profile of the second semiconductor layer desirably by control ling the carrier concentration of the first semiconductor layer, the growing temperatures, the growing times and the growing thicknesses of the second semiconductor layer.

The second semiconductor layer may be formed by epitaxial growth method. Each of the first and second semiconductor layers may consist of preferably a semiconductor included in the III–V periodical group, and more preferably GaAs or GaAlAs. The diffusion of the impurity may be carried out by thermal treatment after forming the second semiconductor layer, or with using heat generated when forming the second semiconductor layer. The impurity may be Zn which has a high diffusion coefficient, for example.

Therefore, the step (a) may be a step of growing a second semiconductor layer consisting of GaAlAs by epitaxy on a semiconductor substrate which corresponds to a first semiconductor layer consisting of GaAs which is highly doped with Zn, and the step (b) may be a step of diffusing Zn as an impurity from the first semiconductor layer to the second semiconductor layer by thermal diffusion.

BRIEF DESCRIPTION OF THE DRAWINGS

This invention will be explained in more detail in conjunction with appended drawings, wherein.

DESCRIPTION OF THE PREFERRED EMBODIMENT

A preferred embodiment of this invention will be described below by referring to the attached drawings. In the preferred embodiment, a method for fabricating a double hereto junction type light emitting device will be explained as an example.

Figure 1:
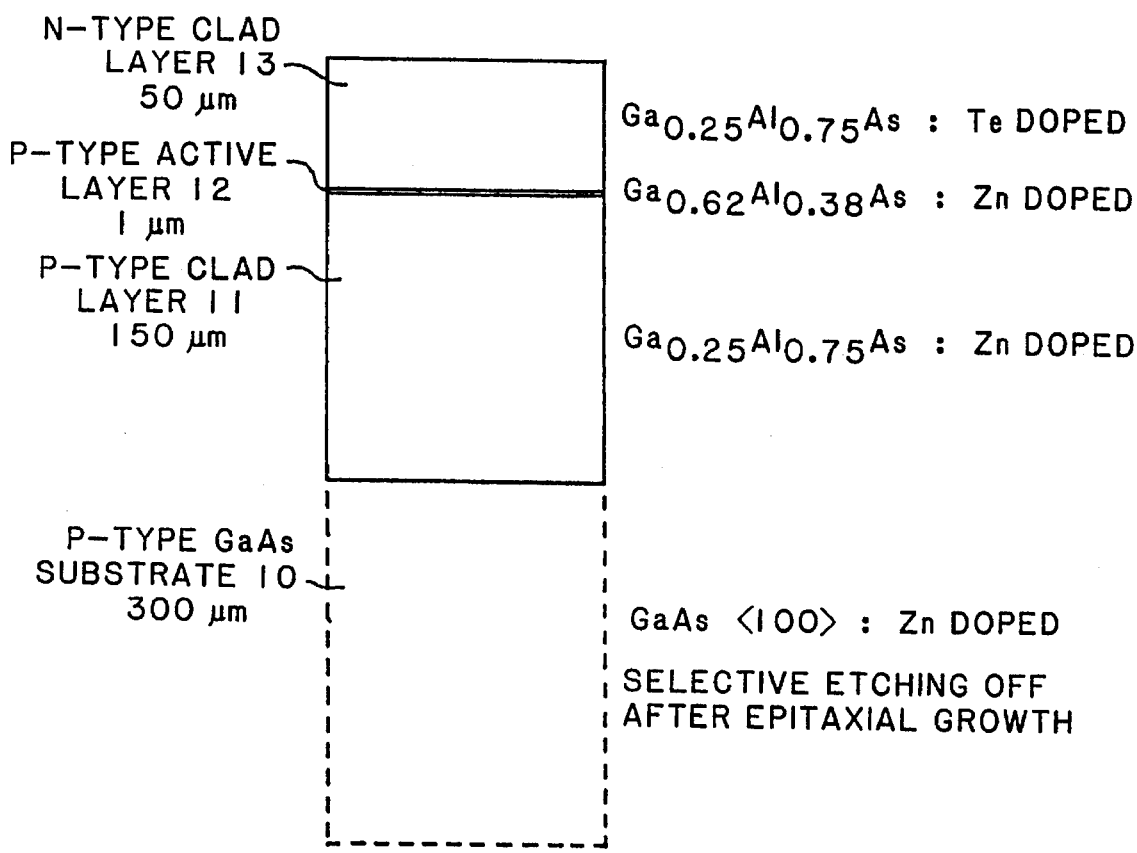
FIG. 1 is an explanatory view showing the depth-wise structure of the light emitting device fabricated by the method in a preferred embodiment according to the invention.
Figure 2A:
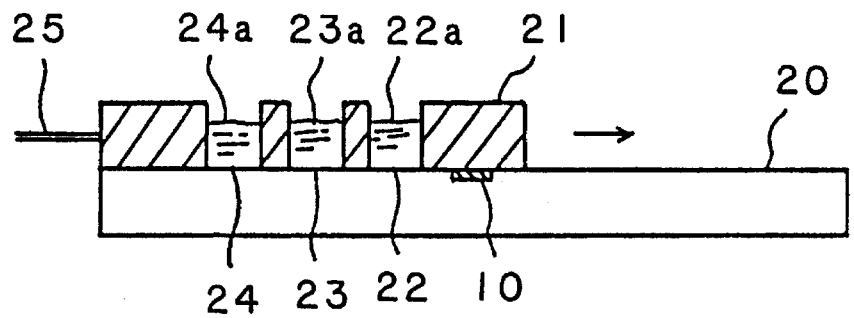
FIGS. 2a to 2e are explanatory views showing steps of a method for fabricating a light emitting device in the preferred embodiment according to the invention.
Figure 2B:
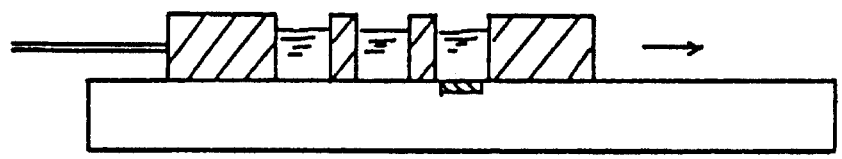
Figure 2C:
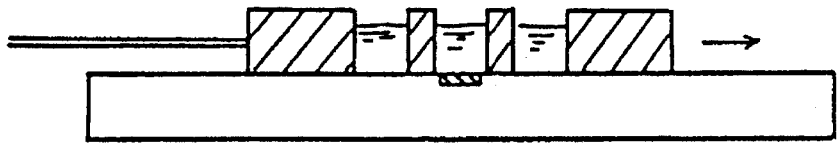
Figure 2D:
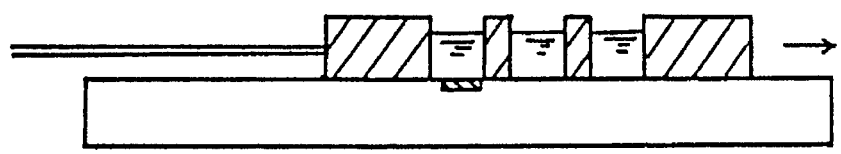
Figure 2E:
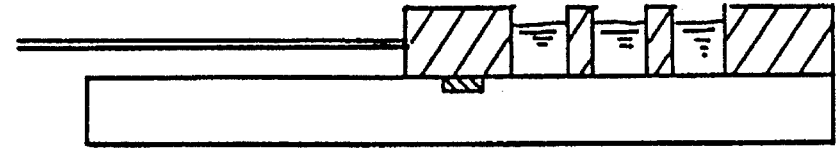

FIG. 1 is a cross-sectional view showing the depth-wise structure of the light emitting device fabricated by the method in the preferred embodiment according to the invention. In the light emitting device, a three-layer structure of epitaxial layers is formed on a p-type GaAs <100> substrate 10 doped with Zn of a high concentration as high as $1\times10^{19}$ atoms $cm^{-3}$ as an impurity.

In more detail, a p-type clad layer 11 having a thickness of 150 μm consisting of a $Ga_{0.30}Al_{0.70}As$ mixed crystal type compound semiconductor doped with Zn as an impurity to have the predetermined concentration profile in the depth-wise, a p-type active layer 12 having a thickness of 1 μm consisting of a $Ga_{0.62}Al_{0.38}As$ mixed crystal type compound semiconductor doped with Zn as an impurity to have the predetermined concentration, and an n-type clad layer 13 having a thickness of 50 μm consisting of a $Ga_{0.30}Al_{0.70}As$ mixed crystal type compound semiconductor doped with Te as an impurity are consecutively grown by epitaxy on a p-type GaAs <100> substrate 10 doped with Zn as an impurity to have a concentration of 1 to $3\times10^{19}$ atoms $cm^{-3}$. The p-type clad layer 11 of the three layers is doped with Zn as an impurity by the method which characterizes the method for fabricating the light emitting device in the preferred embodiment. The p-type GaAs substrate 10 may be removed at need by selective etching after the epitaxial layers are grown.

Figure 3:
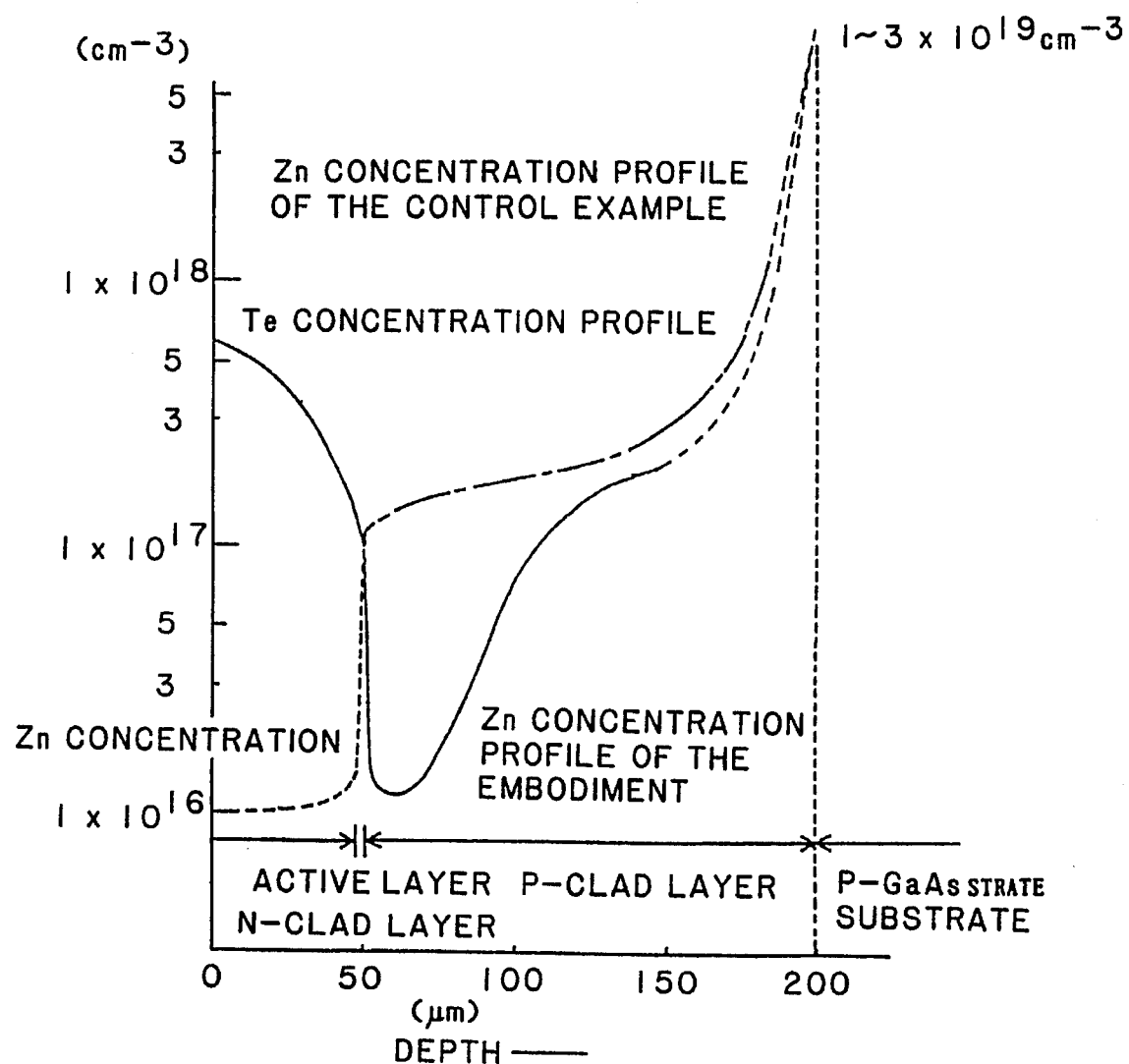
FIG. 3 is a graph showing a temperature sequence in the preferred embodiment according to the invention.

Next, the method for fabricating the light emitting device in the preferred embodiment will be explained in conjunction with FIGS. 2 and 3. This embodiment shows the method in which each semiconductor layer is grown by the epitaxial growth method, especially the liquid phase growth method. Here, the slide-boat method using a slide-boat is shown. Also shown is the gradual cooling method in which the growing is conducted by lowering the temperature gradually.

In FIG. 2, the p-type GaAs substrate 10 is secured on a boat body 20 in such a way that its top surface is flush with the top surface of the boat body 20. A first solution reservoir 22 which contains a Ga solution 22a for growth of a clad layer, a second solution reservoir 23 which contains a Ga solution 23a for growth of a p-type active layer, and a third solution reservoir 24 which contains a Ga solution 24a for growth of an n-type clad layer are set up in a sliding member 21 which slides on the boat body 20. Each solution reservoir does not have a bottom, so that each solution directly soaks the top surface of the boat body 20. The Ga solution 22a for growth of the clad layer and the Ga solution 24a for growth of the n-type clad layer are the solutions consisting mainly of melted $Ga_{0.30}Al_{0.70}As$. The Ga solution 24a contains Te as an n-type impurity to have a predetermined concentration in the n-type clad layer 13, however, the Ga solution 22a contains no impurity or a very small amount of Zn as a p-type impurity. The p-type clad layer 11 which is to be formed by the Ga solution 22a for growth of the clad layer is supplied with Zn which is diffused from the p-type GaAs substrate 10 in the thermal steps including the step of growing the p-type clad layer 11 and the following step of growing the p-type active layer 12 to have a predetermined concentration profile in the p-type clad layer 11. On the other hand, the Ga solution 23a for growth of the p-type active layer consists mainly of melted $Ga_{0.62}Al_{0.38}As$ containing Zn as a p-type impurity to have a predetermined concentration in the p-type active layer. However, a Ga solution for growth of an active layer which contains no impurity or a very small amount of Zn may be used instead of the Ga solution 23a for growth of the p-type active layer, as like in the case of the Ga solution 22a for growth of the clad layer. In such a case, the p-type active layer 12 which is to be formed by the Ga solution for growth of the active layer is control led with Zn diffused from the p-type GaAs substrate 10. The sliding member 21 is moved by a handling rod 25.

Next, we describe the process using the equipment described above to form the three epitaxial growth layers on the p-type GaAs substrate 10. First, using the handling rod 25, the sliding member 21 is slid in the direction of the arrow from the position indicated in FIG. 2(a) to set the Ga solution 22a for growth of the p-type clad layer which is heated to 950° C. ($T_1$ in FIG. 3) in the first reservoir 22 on the p-type GaAs substrate 10, and the p-type clad layer 11 is grown under the conditions where the temperature is lowered from 950° C. ($T_1$) to 900° C. ($T_2$ in FIG. 3), for example (FIG. 2 (b)). Then, the temperature is kept at $T_2$ for a period $t_0$ (FIG. 3) so that Zn is diffused further while the p-type clad layer 11 is not growing. Then, the temperature is lowered to 890° C. ($T_3$ in FIG. 3), Then, the sliding member 21 is slid further in the direction of the arrow to set the Ga solution 23a for growth 4 of the p-type active layer in the second reservoir 23 on the p-type GaAs substrate 10, and the p-type active layer 12 is grown under the conditions where the temperature is lowered from 890° C. ($T_3$) to 887° C. ($T_4$ in FIG. 3), for example (FIG. 2(c)). The sliding member 21 is then slid further in the direction of the arrow to set the Ga solution 24a for growth of the n-type clad layer in the third reservoir 24 on the p-type GaAs substrate 10, and the n-type clad layer 13 is grown under the conditions where the temperature is lowered from 887° C. ($T_4$) to 800° C. ($T_5$ in FIG. 3), for example (FIG. 2 (d)). In these thermal processes, Zn which is highly doped in the p-type GaAs substrate 10 is diffused to the clad layer. The diffusion of Zn is controlled by changing the temperature condition. The diffusion speed becomes high if the temperature $T_2$ is relatively high, and Zn diffuses deeply as the period $t_0$ becomes long. Consequently, the clad layer becomes the p-type clad layer 11 having a predetermined impurity concentration profile with the low concentration region (approximately $1\times10^{16}$ atoms $cm^{-3}$) in the vicinity of the p-type active layer 12. After this, the sliding member 21 is slid further in the direction of the arrow to complete the growth process (FIG. 2 (e)).

After forming the three layer double hetero structure on the p-type GaAs substrate 10, as described above, electrodes are formed on both sides of the three layer structure to obtain the light emitting device. The substrate may be removed by selective etching if necessary.

Figure 4:
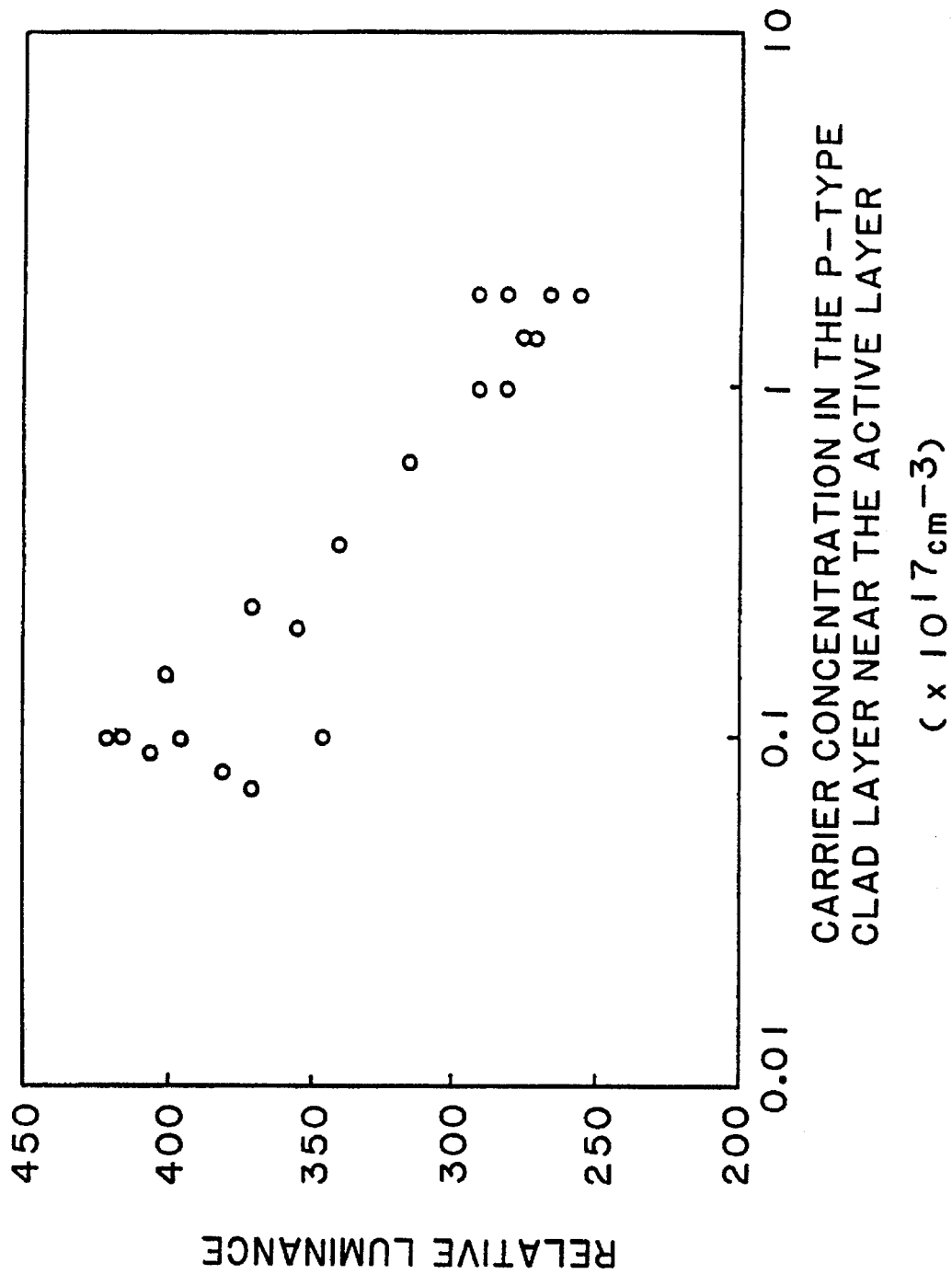
FIG. 4 is a graph showing the depth-wise carrier concentration profile of the light emitting device fabricated by the method in the preferred embodiment according to the invention.

FIG. 4 shows a depth-wise carrier concentration profile of the light emitting device fabricated by the method in the embodiment as described above. The carrier concentration in the p-type clad layer 11 near the p-type GaAs substrate 10 is approximately equivalent to the carrier concentration in the substrate (1 to $3\times10^{19}$ atoms $cm^{-3}$). However, the closer to the p-type active layer 12, the lower the carrier concentration in the p-type clad layer 11 becomes, and it is as low as $1\times10^{16}$ atoms $cm^{-3}$ near the junction with the p-type active layer 12. The carrier concentration profile in the p-type clad layer grown on the substrate may be controlled by Gausian distribution of a p-type impurity from the substrate. On the other hand, the carrier concentration in the p-type active layer 12 is approximately $1\times10^{17}$ atoms $cm^{-3}$. The carrier concentration in the n-clad layer 13 increases from approximately $1\times10^{17}$ atoms $cm^{-3}$, which is equivalent to the carrier concentration in the p-type active layer, to approximately $6\times10^{17}$ atoms $cm^{-3}$ in the top region. FIG. 4 also shows a depth-wise carrier concentration profile in the p-type clad layer which is grown from the Ga solution for growth of the p-type clad layer which contains Zn before growth, as a comparable example.

The carrier concentration in the p-type clad layer 11 according to the instant invention is quite low as equal to $5\times10^{16}$ atoms $cm^{-3}$ or lower in the surface region far from the substrate, that is in the vicinity of the p-type active layer 12, as understood by FIG. 4. It has been confirmed by the inventors that the light emitting device having the carrier concentration profile including the p-type clad layer 11 formed by the method in the preferred embodiment has the high relative luminance.

Figure 5:
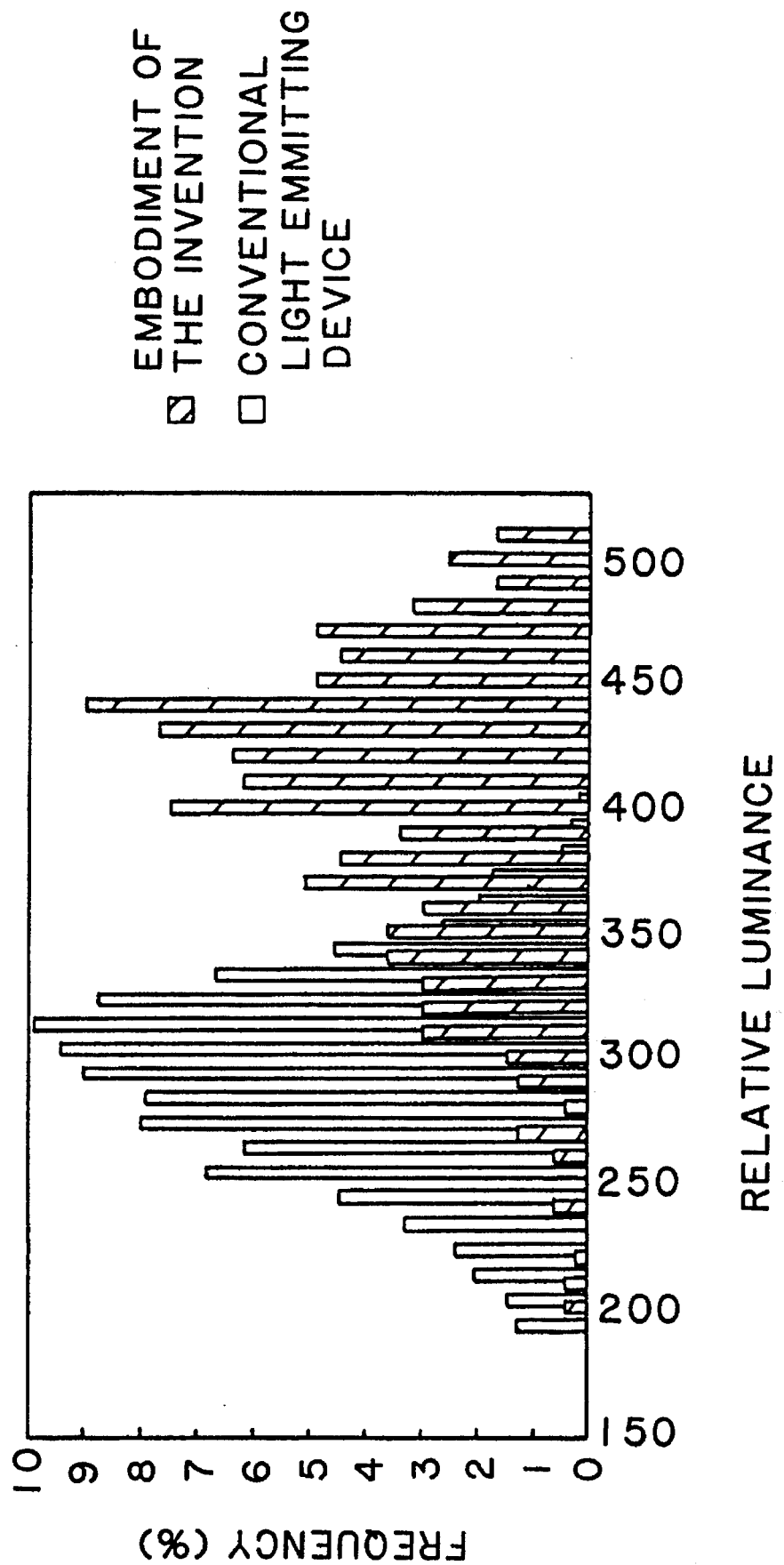
FIG. 5 is a graph showing the relationship between the carrier concentration in the p-type clad layer in the vicinity of the active layer and the relative luminance of the light emitting device.

FIG. 5 shows the relationship between the carrier concentration in the p-type clad layer 11 near the p-type active layer 12 and the relative luminance of the light emitting device. It is shown that as the carrier concentration in the p-type clad layer 11 near the p-type active layer 12 decreases, the relative luminance of the light emitting device increases. Especially, the relative luminance, in the concentration range 1 to $2\times10^{16}$ atoms $cm^{-3}$, is very high, approximately 400.

The description in the method for fabricating a semiconductor device in the embodiment has been carried out in case of the double hereto junction type light emitting device, especially in the case of growing each semiconductor layer on a semiconductor substrate by epitaxy, however, the method may be applied to any other semiconductor device.

Further, a semiconductor layer such as an epitaxial growth layer which is doped with an impurity of high concentration may be used as an impurity source (a diffusion source) instead of the semiconductor substrate as in the embodiment. In such a case, a semiconductor layer formed on the other semiconductor layer with highly impurity concentration is doped thereby.

As described above, in a method for fabricating a semiconductor device including a semiconductor layer formed on a highly doped semiconductor substrate, the semiconductor layer is doped with an impurity diffused from the semiconductor substrate as an impurity source to make the semiconductor layer have a predetermined carrier concentration, so that it is able to easily control the carrier concentration of the semiconductor layer such as a clad layer in a double hereto junction type light emitting device to be within the relatively low concentration range. Therefore, a semiconductor device with a high performance can be obtained by the method.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for fabricating a double hetero junction type light emitting device having a first semiconductor single crystal substrate layer of p-type conductivity, a second semiconductor single crystal layer of p-type conductivity as a clad layer, a third semiconductor single crystal layer of p-type conductivity as an active layer, and a fourth semiconductor single crystal layer of n-type conductivity as a clad layer comprising the steps of:

preparing said first semiconductor single crystal substrate layer of a compound semiconductor selected from GaAs and GaAlAs doped with a p-type active impurity;

growing said second semiconductor single crystal layer of GaAlAs on said first semiconductor single crystal substrate layer by means of a liquid phase epitaxial growth method using a Ga solution with no p-type impurity added;

growing said third semiconductor single crystal layer of GaAlAs on said second semiconductor single crystal layer by means of a liquid phase epitaxial growth method using a Ga solution with a p-type impurity added; and growing said fourth semiconductor single crystal layer of GaAlAs on said third semiconductor single crystal layer by means of a liquid phase epitaxial growth method using a Ga solution containing an n-type impurity.

2. A method in accordance with claim 1 wherein growing temperatures and growing speed of said second to fourth semiconductor single crystal layers are selected to control carrier concentration profile in each layer.

3. A method in accordance with claim 1 wherein carrier concentration of said second semiconductor single crystal layer adjacent to said first semiconductor single crystal layer is equivalent to that of said first semiconductor single crystal layer, and the carrier concentration across said second semiconductor single crystal layer decreases when approaching said third single semiconductor single crystal layer and is less than said third semiconductor single crystal layer.

4. A method in accordance with claim 1 wherein a growing temperature sequence in relation to growing time is used to control the carrier concentration profile of said second semiconductor single crystal layer.

5. A method in accordance with claim 4 wherein temperature is kept unchanged to stop growing of said second semiconductor single crystal layer while a diffusion of said p-type active impurity in said first semiconductor single crystal substrate layer to said second semiconductor single crystal layer continues.

6. A method for fabricating a double hetero junction type light emitting device having a first semiconductor single crystal substrate layer of p-type conductivity, a second semiconductor single crystal layer of p-type conductivity as a clad layer, a third semiconductor single crystal layer of p-type conductivity as an active layer, and a fourth semiconductor single crystal layer of n-type conductivity as a clad layer comprising the steps of:

preparing a first semiconductor single crystal substrate layer of a compound semiconductor selected from GaAs and GaAlAs doped with a p-type active impurity;

growing said second single crystal layer of GaAlAs on said first semiconductor single crystal substrate layer by means of a liquid phase epitaxial growth method using a Ga solution with no p-type impurity added;

controlling the p-type impurity concentration in the region of said second semiconductor single crystal layer adjacent to said third semiconductor single crystal layer by controlling the temperature and time of growth of said second semiconductor single crystal layer; and growing a third semiconductor single crystal layer with a Ga solution containing a p-type impurity wherein said third semiconductor single crystal layer has a p-type carrier concentration greater than the p-type carrier concentration of said second semiconductor single crystal layer in the area adjacent to said third semiconductor single crystal layer.

7. A method in accordance with claim 1 wherein said first semiconductor single crystal substrate layer is doped with Zn.

* * * * *